United States Patent
Toyama et al.

(10) Patent No.: US 6,560,767 B2
(45) Date of Patent: May 6, 2003

(54) PROCESS FOR MAKING PHOTOMASK PATTERN DATA AND PHOTOMASK

(75) Inventors: Nobuhito Toyama, Tokyo (JP); Naoki Shimohakamada, Tokyo (JP); Wakahiko Sakata, Tokyo (JP)

(73) Assignee: Dainippon Printing Co., Ltd., Tokyo (JP)

( * ) Notice: Subject to any disclaimer, the term of this patent is extended or adjusted under 35 U.S.C. 154(b) by 122 days.

(21) Appl. No.: 09/854,841

(22) Filed: May 14, 2001

(65) Prior Publication Data

US 2002/0028523 A1 Mar. 7, 2002

(30) Foreign Application Priority Data

May 16, 2000 (JP) ........................................ 2000-142813

(51) Int. Cl.[7] .............................................. G06F 17/50
(52) U.S. Cl. ...................................................... 716/21
(58) Field of Search ............................... 716/2, 19, 20, 716/21

(56) References Cited

U.S. PATENT DOCUMENTS 4,628,466 A * 12/1986 Tymes .......................... 716/21

* cited by examiner

Primary Examiner—Matthew Smith
Assistant Examiner—Thuan Do
(74) Attorney, Agent, or Firm—Flynn, Thiel, Boutell & Tanis, P.C.

(57) ABSTRACT

A process for making photomask pattern data comprises the steps of: (a) a first step for fetching original data of design data as digital data; (b) a second step for extracting the information on distortion (deformation) of formed pattern of from the original figure data when producing a photomask using the original figure data; (c) a third step for extracting the information on the information on distortion (deformation) of formed pattern when producing a pattern on a wafer using the photomask; (d) a fourth step for obtaining the information for determining parts to be corrected and the amount of correction by combining the information obtained in the second step and the information obtained in the third step; and (e) a fifth step for generating the correction figure for correction applied to the original figure data of design data, on the basis of the information obtained in the fourth step, so that correction pattern data is obtained. By the process for making photomask pattern data, photomask pattern data can be made which is the correction data obtained by correcting the original figure data for forming photomask by which the objective shape of pattern can be obtained on a wafer.

3 Claims, 7 Drawing Sheets (i)

PATTERN EXPOSURE →

(ii)

810 DESIGN FIGURE DATA

815 FORMED PATTERN (i)

PATTERN EXPOSURE →

(ii)

810

850 CORRECTION FIGURE DATA

825 FORMED PATTERN

PROCESS FOR MAKING PHOTOMASK PATTERN DATA AND PHOTOMASK

FIELD OF INDUSTRIAL APPLICATION

The present invention relates to a process of correction of design data for the production of photomask coping with miniaturization and high-density of semiconductor. Particularly, the present invention relates to a method for correcting original figure data used in the pattern exposure system for forming a pattern of photomask as to obtain the objective shape of pattern on a wafer.

BACKGROUND OF THE INVENTION

Recently, from a tendency for electric equipment to be made highly functional and lighter, thinner, shorter and smaller, it is being desired more and more that several LSI's typified by ASIC (application specific integrated circuit) are made highly integrated and highly functional. Namely, to realize the high function is desired for LSI such as ASIC by reducing the size of chip.

The process for forming semiconductor device is made through several steps in such a manner that figure data for forming photomask pattern (it is also called "pattern data" are made through function design, logical design, circuit design, layout design and others, a photomask is produced using the figure data, thereafter the pattern of photomask is transferred on a wafer by the pattern reduction exposure, so that the above-mentioned LSI such as ASIC is produced.

In general, a photomask is made through several steps in such a manner that pattern exposure is given to photosensitive resist disposed on the shielding film of a photomask substrate for (the shielding film of photomask substrate is also called "photomask blank") using the above-mentioned figure data ("pattern data") and by means of the electron beam pattern exposure system or the photo pattern exposure system projecting rays such as excimer wavelength, steps such as development and etching are made, by which a photomask is produced.

Namely, ionizing radiation is applied to given areas of photosensitive resist is coated on a shielding metallic thin film of photomask substrate provided on one side of glass substrate and dried, by means of the pattern exposure system, by which a latent image is formed. Then, the photosensitive resist having latent image is developed, by which a resist pattern with a desired shape is formed corresponding to the irradiation area of ionizing radiation. Thereafter, the metallic film is worked following the resist pattern by etching using the resist pattern as etching-proof resistance resist so that a photomask with a desired metallic film pattern is obtained.

In case of a pattern of photomask being transferred to a wafer by reduction exposure, a photomask is also called a reticule pattern.

When a pattern of photomask is transferred to a wafer by reduction exposure, a distortion of the shape of exposure called optical proximity effect is appeared. The reason because when a size of the shape of exposure (a size of pattern exposure to wafer) approaches wavelength of exposure light or becomes smaller than wavelength of light, exposure faithful to the shape of pattern of photomask becomes impossible by the phenomenon of diffraction so that the shape of pattern of photomask exposed to the wafer distortion is distorted on a wafer.

In a case where a pattern of photomask (the shape of part of photomask not transmitting light) has the shape as shown in FIG. 8A(i), the shape formed on a wafer becomes as shown in FIG. 8A(ii). Therefore, when it is desired to obtain the shape of pattern on a wafer as shown in FIG. 8A(i), a pattern of photomask (the shape of part of photomask not transmitting light) is corrected as shown in FIG. 8B(i) so that the shape of pattern formed on a wafer is made as shown in FIG. 8B(ii). Such a correction made in consideration of the influence of diffraction of light is called OPC (Optical Proximity Correction).

Hereafter, as to figure data for forming a pattern of photomask, data not having the correction made in consideration of distortion (deformation) when producing a mask and when producing a wafer according to the circuit design is called original figure data of design data, or original figure data. Further, data having the correction made in consideration of distortion (deformation) when producing a mask and when producing a wafer is called correction figure data. In general, the process for carrying out the optical proximity correction given to original figure data is called the OPC process, and correction data in which original figure data is corrected through the optical proximity correction is also called the OPC process data. Figure data is also called pattern data Figure data for forming a pattern of photomask is formed according to various information, which is expressed in the X-Y coordinates.

Referring to FIGS. 4 and 5, a first conventional example of a method for generating correction figure data is explained. Further, referring to FIGS. 6 and 7, a second conventional example of a method for generating correction figure data is explained.

FIG. 4 is a flow sheet of a first conventional example for generating correction figure data. FIG. 5A(i) and FIG. 5B(i) show an example of original figure data. In case of the example shown in FIG. 5A(i), correction is needed for corners of figure. In case of the sample shown in FIG. 5 B(i), correction is needed for parts of figure in which the parts are arranged sparsely.

FIG. 5A(ii) and FIG. 5B(ii) show patterns in which correction figures are generated for original figure data shown in FIG. 5A(i) and FIG. 5B(i) according to the first conventional method, respectively. FIG. 5A(iii) and FIG. 5B(iii) show patterns transferred to wafers (hereafter called "wafer patterns") through photomasks having the shapes of pattern shown in FIG. 5A(ii) and FIG. 5B(ii), respectively.

FIG. 6 is a flow sheet of the second conventional method for generating correction figure data. FIG. 7A(i) and FIG. 7B(i) show original figure data, respectively. FIG. 7A(ii) and FIG. 7B(ii) show patterns in which correction figures are generated according to the second conventional method. FIG. 7A(iii) and FIG. 7B (iii) show patterns transferred to wafers through photomasks produced by patterns shown in FIG. 7A(ii) and FIG. 7B(ii), respectively.

Hereafter, to make this description plain, original figure data shown in FIG. 5A(i) and FIG. 5B(i) are made the same as original figure data shown in FIG. 7A(i) and FIG. 7B(i).

Further, "S410" to "S490" in FIG. 4 and "S610" and "S670" in FIG. 6 designate steps of process.

The first conventional method is a method for determining the correction figure data for optical proximity correction according to the information on deformation generated when original figure data is transferred to a wafer by optical proximity effect.

The production of photomask is carried out using figure data in which only the optical proximity correction process (OPC process) is given to original figure.

This method is based on the assumption that the faithfulness or correctness of pattern formed on a photomask to original pattern can be kept. Namely, slight difference is generated between original figure data and a pattern formed on a photomask in the production. However, heretofore, it was thought that patterns to be formed are not small so far so that the influence on quality brought about by the difference between the two can neglected.

In this case, patterns (figures) determined according to the information on deformation when forming original figure patterns by optical proximity effect obtained in advance, in this example, a figure of square is generated at corners of original figure data shown in FIG. 5B(i). On the other hand, the figures for correcting the phenomenon that width of parts of original figure data as shown in FIG. 5B(i) in which the parts are disposed sparsely becomes thin are generated.

When a pattern is transferred to a wafer through the photomask produced using pattern data with the above-mentioned figures for correcting to the phenomenon, patterns (figures) shown in FIG. 5A(iii) and FIG. 5B(iii) are formed on a wafer.

However, recently, the miniaturization and high-density of mask pattern accompanied by the miniaturization and high-density forming of wafer pattern progresses further so that the faithfulness of a pattern formed on a photomask to original figure data, set heretofore as a premise, comes to not be kept. Therefore, the necessity for the consideration of the influence of the difference between original figure data and a pattern formed on a photomask, which difference will affect a wafer pattern formed on a wafer, was appeared.

Accordingly, in the second conventional method, the faithfulness of a photomask to original figure data is kept by further giving the correction made in consideration of distortion (deformation) in the production of photomask to the figure data in which only the process of optical proximity correction process (OPC process) is given to original figure data.

In the second method, when forming a photomask on a glass substrate, further correction pattern determined according to the information on deformation of the shape of pattern in contrast to the original figure data, according to the shape of pattern and the arrangement thereof, is added to the corrected pattern shown in FIG. 5.

Correction pattern is added to corners of correction pattern (correction FIG. 521) is shown in FIG. 5A(ii) and FIG. 5B(ii) in consideration of distortion (deformation) in the production of photomask, and further, the correction for edges is added to the figure for correcting the phenomenon that a width of parts in which the parts are arranged sparsely become thin, by which the correction figure pattern can be obtained as shown in FIG. 7(A)(ii) and FIG. (B)(ii).

However, in the present conditions where produced LSI is made high-density and the amount of figure data included in design data is increased rapidly, there is a tendency for a time taken for the process for such a correction pattern to be increased.

Therefore, if the correction pattern is applied to original figure pattern according the first conventional method and further another correction is applied to the corrected figure pattern, the process cannot be carried out within practical processing time. As a result, data size for producing a photomask becomes impractical.

Namely, the first conventional method has a problem that the faithfulness of a photomask actually formed to original figure pattern is lost. The second conventional method has a problem that many resources are needed for producing devices such as a computer for generating corrected pattern, a pattern exposure system, and therefore this method is not a practical method.

As above-mentioned, under a circumstance that miniaturization and high-density of mask pattern is further progressed recently, the necessity for consideration to be given to that the difference between original figure data and a pattern formed on a photomask influences a wafer pattern formed on a wafer came out. Therefore, it was desired to cope with the aforementioned necessity was obtained.

The present invention aims at the provision of a process for making mask pattern data which is the correction data in which original figure data is corrected, for forming a photomask, wherein the correction data makes possible to obtain the objective pattern on a wafer, in the middle of miniaturization and high-density of mask F74 pattern being progressed recently.

At the same time, the present invention aims the provision of a process for making photomask pattern data, which makes possible for process to be carried out in practical processing time without the proposed (conventional) data of tremendous amount to be processed.

DISCLOSURE OF THE INVENTION

A process for making photomask pattern of the present invention is a process for making photomask pattern data in which correction pattern data obtained by correcting original figure data of design data used in the pattern exposure system for carrying out pattern exposure for forming a pattern of photomask in order to obtain the objective shape of pattern on a wafer is newly generated as the figure data for the pattern exposure system, wherein the method comprises the steps of: (a) a first step for fetching original data of design data as digital data; (b) a second step for extracting the information on distortion (deformation) of formed pattern of from the original figure data when producing a photomask using the original figure data; (c) a third step for extracting the information on the information on distortion (deformation) of formed pattern when producing a pattern on a wafer using the photomask; (d) a fourth step for obtaining the information for determining parts to be corrected and the amount of correction by combining the information obtained in the second step and the information obtained in the third step; and (e) a fifth step for generating the correction figure for correction applied to the original figure data of design data, on the basis of the information obtained in the fourth step, so that correction pattern data is obtained.

Further, in the above-mentioned process for making photomask pattern data, in the third step, the amount of distortion (deformation) by diffraction of light at several parts when transferring a mask pattern with the same shape as original figure pattern on a wafer is extracted, by the comparison of a measurement of wafer after a test of transferring of a pattern on a wafer using a test photomask with the test photomask or by simulation, which extracted data of the amount of distortion can be used as the information on distortion (deformation) of formed pattern.

A photomask of the present invention is a photomask formed through pattern exposure, developing, and etching, using the correction pattern data obtained by correcting original figure data of design data used in the pattern exposure system for carrying out pattern exposure for a pattern of photomask in order to obtain the objective shape of pattern on a wafer, characterized in that the photomask is formed using the correction pattern data made according to the above-mentioned process for making photomask pattern data.

A process for making photomask pattern data of the present invention enables the provision of a process for making photomask pattern data for making photomask pattern data for forming photomask, in which the objective shape of pattern can be obtained on a wafer under such a circumstance that miniaturization and high-density of mask pattern is progressed.

At the same time, the present invention aims at the provision of a process for making photomask pattern data which data enables the process in practical processing time without the proposed (conventional) data of tremendous amount to be processed.

Concretely, this is achieved by a process for making photomask pattern data in which correction pattern data obtained by correcting original figure data of design data used in the pattern exposure system for carrying out pattern exposure for forming a pattern of photomask in order to obtain the objective shape of pattern on a wafer is newly generated as the figure data for the pattern exposure system, wherein the method comprises the steps of: (a) a first step for fetching original data of design data as digital data; (b) a second step for extracting the information on distortion (deformation) of formed pattern of from the original figure data when producing a photomask using the original figure data; (c) a third step for extracting the information on the information on distortion (deformation) of formed pattern when producing a pattern on a wafer using the photomask; (d) a fourth step for obtaining the information for determining parts to be corrected and the amount of correction by combining the information obtained in the second step and the information obtained in the third step; and (e) a fifth step for generating the correction figure for correction against the original figure data of design data, on the basis of the information obtained in the fourth step, so that correction pattern data is obtained.

The third step enables to obtain relatively simply the amount of distortion (deformation) by diffraction of light, by extracting the amount of distortion (deformation) by diffraction of light at several parts when transferring a mask pattern with the same shape as original figure pattern on a wafer, by the comparison of a measurement of wafer after a test of transferring of a pattern on a wafer using a test photomask with the test photomask or by simulation, so that the extracted data is used as the information on distortion (deformation) of formed pattern.

BEST MODE FOR CARRYING OUT THE INVENTION

Figure 1:
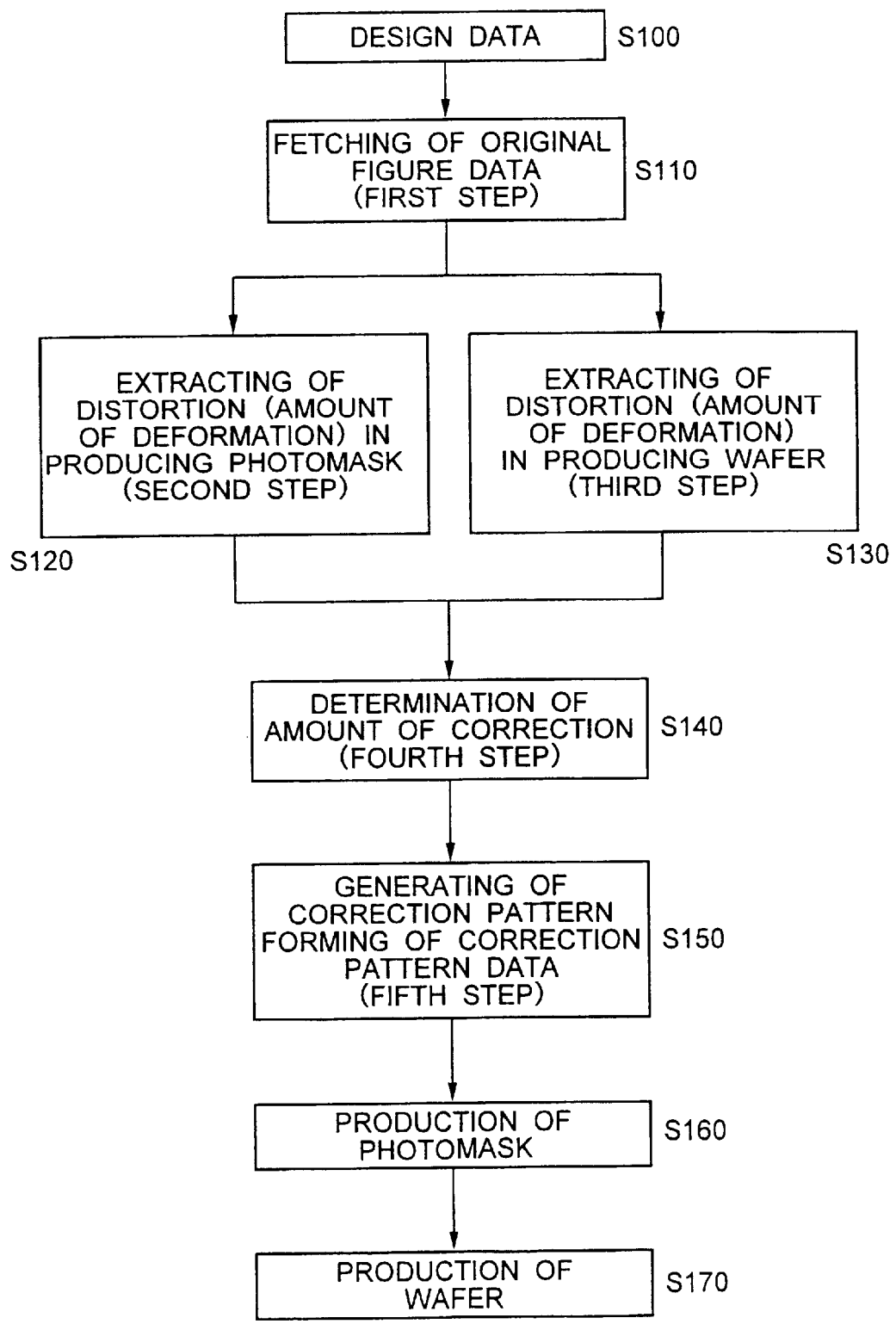
FIG. 1 is a flow sheet showing an example of mode of working of a process for making figure data of photomask.

Referring to the drawings, one example of best mode of a process for making pattern data of photomask of the present invention is explained.

This example is an example of a process for making photomask pattern data, in which the correction figure data obtained by correcting original figure data of design data is newly generated as the figure data for the raster type of electron beam lithography system used for carrying out the pattern exposure for forming a pattern of photomask in order to obtain the objective shape on a wafer.

Figure 2A:
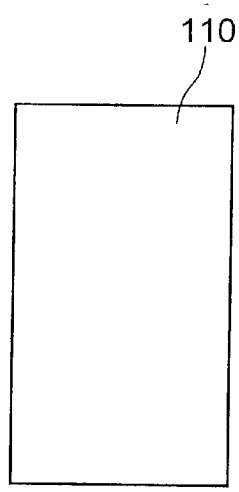
FIGS. 2A, 2B and 2C are views for showing a figure of original figure data, a figure of correction figure data corresponding to the original figure data and a wafer pattern corresponding the original figure data.
Figure 2B:
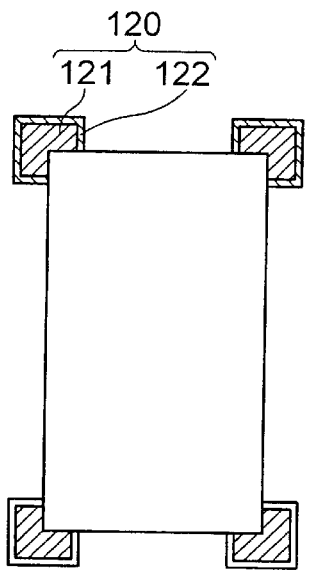
Figure 2C:
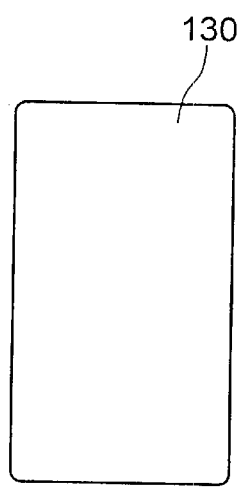
Figure 3A:
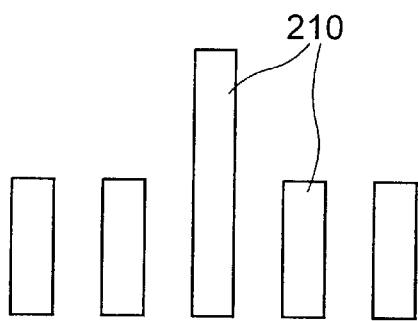
FIGS. 3A, 3B and 3C are views for showing a figure of original figure data, a figure of correction figure data corresponding to the original figure data and a wafer pattern corresponding the original figure data.
Figure 3B:
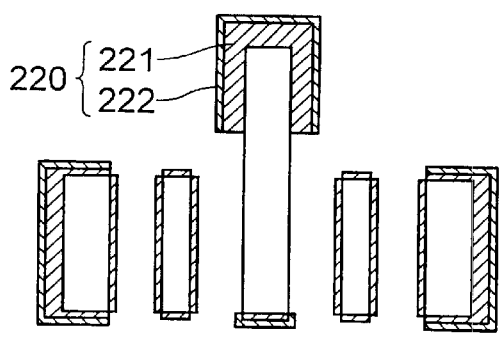
Figure 3C:
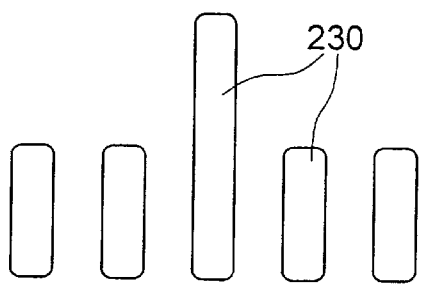

FIG. 1 is a flow sheet of an example of mode of carrying out a process for making figure data of photomask of the present invention, and FIGS. 2 and 3 show a figure of original figure data, a figure of the correction figure data corresponding to the original figure data, and a wafer pattern corresponding to the original figure data, wherein in FIG. 1, S 100 to S170 designate steps of treatment.

In FIGS. 1 to 3, FIG. 5 and FIG. 7, 110 designates a figure of original figure data, 120 designates a correction FIG, 121 and 122 designate the region of the inside of corrected figure, respectively, 130 designates a wafer pattern, 210 designates a figure of original figure data, 220 designates a correction pattern, 221 and 222 designate the region of the inside of correction pattern, respectively, 230 designates a wafer pattern, 510 and 511 designate a figure of original figure data, respectively, 521 designates a correction FIGS, 530 and 531 designate a wafer pattern, respectively, 710 and 711 designate a figure of original figure data, 720 designates a correction FIG, 721 and 722 designate the region of the inside of correction figure, respectively, 730 and 731 designate a wafer pattern, respectively.

First, a first step (S110) is carried out in which original figure data is fetched as digital data from design data (S1OO) formed on the basis of the design of circuit.

The formed design data is usually converted into a given format and fetched to a computer Then, a second step (S120) is carried out in which the information on distortion (deformation) of a formed pattern of from original figure data when producing a photomask by using the original figure data is extracted.

The information on correction of photomask is extracted in expression of X-Y rectangular coordinates.

A photomask is produced using the original figure data. The shape of photomask is inspected, and from this result, distortion (deformation) of from original figure data can be obtained quantitatively.

Figures or groups of figures of given original figure data are modeled, and the information on distortion (deformation) of from a figure or groups of patterns are stored as model in the data base, from which the amount of deformation at several parts of formed pattern can be estimated and the estimated amount may be applied.

As for sparse and dense patterns in which several long line patterns with the length of the sides in the direction of Y being longer than the length of the sides in the direction of X are close to each other as shown in FIG. 3A, the appearance of the difference between the figure of original figure data (FIG. 3A) and a pattern in a photomask differs according to the sparse and dense state of the sparse and dense patterns.

In case of the sparse and dense state being sparse, when pattern of data is exposed on a photomask, the length of sides in the direction of X and the length of sides in the direction of Y in a pattern on a photomask after writing of data become shorter, the thickness of the lines becomes thinner and the length of the lines becomes shorter.

To the contrary, in case of the sparse and dense state being dense where an interval between patterns being opposite to each other is remarkably small, when pattern of data is exposed on a photomask, the length of sides in the direction in which patterns are opposite to each other on the photomask becomes larger and the thickness of the lines becomes thicker.

In corners around which no pattern exists in the original figure data as shown in FIG. 2A, when pattern of data is exposed on a photomask, the length of the corners in the direction of X and the length of the corners in the direction of Y become shorter, respectively, so that corners become round.

On the other hand, a third step (S130) is carried out for extracting the information on distortion (deformation) of the formed pattern generated when producing a pattern by using a photomask.

For the third step, there is given extracting of the amount of distortion or deformation of pattern generated by diffraction of light at several parts when a mask pattern with the same shape as the original figure data is transferred to a wafer by projection, wherein the extracted data is made the information of distortion (deformation) of the formed pattern.

Accordingly, the amount of distortion (deformation) generated by diffraction of light can be extracted in expression of X-Y rectangular coordinates.

For the simulation test system (simulation program) by which the amount of distortion (deformation) generated by diffraction of light when a mask pattern is transferred to a wafer by projection can be obtained, "Prolith" manufactured by Finle Inc. is known. However, the present invention is not restricted thereto.

As for sparse and dense patterns in which several long line patterns with the length of the sides in the direction of Y being longer than the length of the sides in the direction of X are close to each other, as shown in FIG. 3A, the appearance of the difference between a mask pattern with the same shape as the figure of original figure data (FIG. 3A) and a pattern on a wafer differs according to the sparse and dense state of the sparse and dense patterns.

In case of the sparse and dense state being sparse, when pattern of data is exposed on a wafer, the length of sides in the direction of X and the length of sides in the direction of Y in a pattern on a wafer after writing of data become shorter, the thickness of the lines becomes thinner and the length of the lines becomes shorter.

On the other hand, in case of the sparse and dense state being dense in such a manner that an interval between patterns being opposite to each other is remarkably small, when pattern of data is exposed on a wafer, the length of sides in the direction in which patterns are opposite to each other on the wafer become larger and the thickness of the lines becomes thicker.

In corners around which no pattern exist in the original figure data as shown in FIG. 2A, when pattern of data is exposed on a wafer, the length of the corners in the direction of X and the length of the corners in the direction of Y become shorter, respectively, so that corners become round.

Then, a fourth step (S140) is carried out for obtaining the information for determining parts to be corrected and the amount of correction by combining the information obtained in the second step and the information obtained in the third step.

The amount of deformation when producing a photomask and the amount of deformation when transferring a pattern on a wafer are usually different from each other. Therefore, the amount of correction is determined every parts to be corrected by considering both the amounts of deformation when producing a photomask and amount when transferring a pattern to a wafer together.

In original figure data, as to sparse and dense patterns in which several long line patterns with the length of the sides in the direction of Y is longer than the length of the sides in the direction of X are close together, as shown in FIG. 3A, correction figure data with the width corresponding to the corrected amount in the direction of X and the length of parts to be corrected in the direction of Y against the original figure data is generated.

In this case, when producing a photomask and when forming a wafer pattern, an original figure is corrected according to the correction figure data having the width of the amount of correction in the direction of X taken against the original figure data in parts where the sides in the direction of X become longer and the length of parts to be corrected in the direction of Y.

When producing a photomask and when forming a wafer pattern, the correction figure data is generated which has the width of the amount of correction of the direction of Y taken against the original figure data in parts where the sides in the direction of Y become shorter, and the length of parts to be corrected in the direction of X.

The amount of correction given to sparse and dense patterns of original patterns (FIG. 3A) is obtained by adding the amount of correction determined according to the distortion (deformation) generated when producing a photomask and the amount of correction determined according to the distortion (deformation) when forming a wafer patter, wherein the correction figure data is generated corresponding to these amounts of correction.

At corners around which no patterns exists as shown in FIG. 2A, in the original figure data, the length of the direction of X and the length of the direction of Y at corners become smaller, respectively, so that the corners become, in which the correction patterns formed of squares having sides of a length of L in the direction of X and sides of a length of L in the direction of Y are generated in such a manner that centers of the respective correction patterns are positioned at tips of corners and that the sides of the squares of the direction of X run parallel to the sides of the corners of the direction of X.

L amounts to the sum of the amounts of correction determined according to the distortion (deformation) when producing a photomask and the amount of correction determined according to the distortion (deformation) generated when forming a wafer pattern.

In FIGS. 2 and 3, 121 and 222 correspond to the amount of correction determined according to the distortion (deformation) generated when forming a wafer pattern. 122 and 222 correspond to the amounts of correction determined according to the distortion (deformation) when producing a photomask.

Then, a fifth step (S150) for obtaining the correction pattern data is carried out by generating the correction pattern for correction against the original figure data of design data on the basis of the information obtained in the fourth step.

In the present example, in order to generate the patterns for correction, data for determining the positions and dimensions of the rectangles to be generated is obtained from the information obtained in the fourth pattern, and the correction pattern data is obtained which is formed of the combination of the original figure data with the correction pattern.

Then, a photomask is produced using the correction pattern data obtained in the fifth step (S160). Then, a pattern is exposed on a wafer using formed photomask (S 170).

Figure 4:
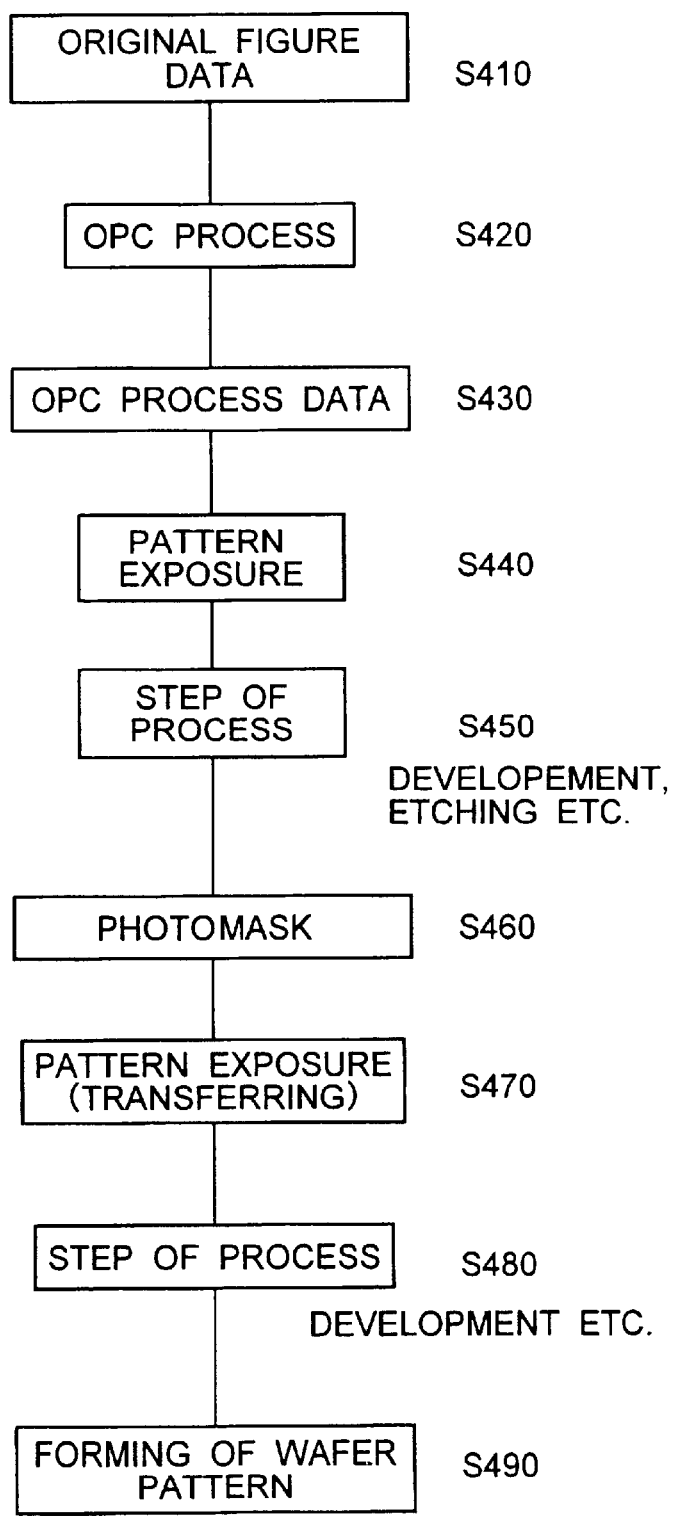
FIG. 4 is a flow sheet of a first example of a conventional method for generating a correction figure data.
Figure 5A:
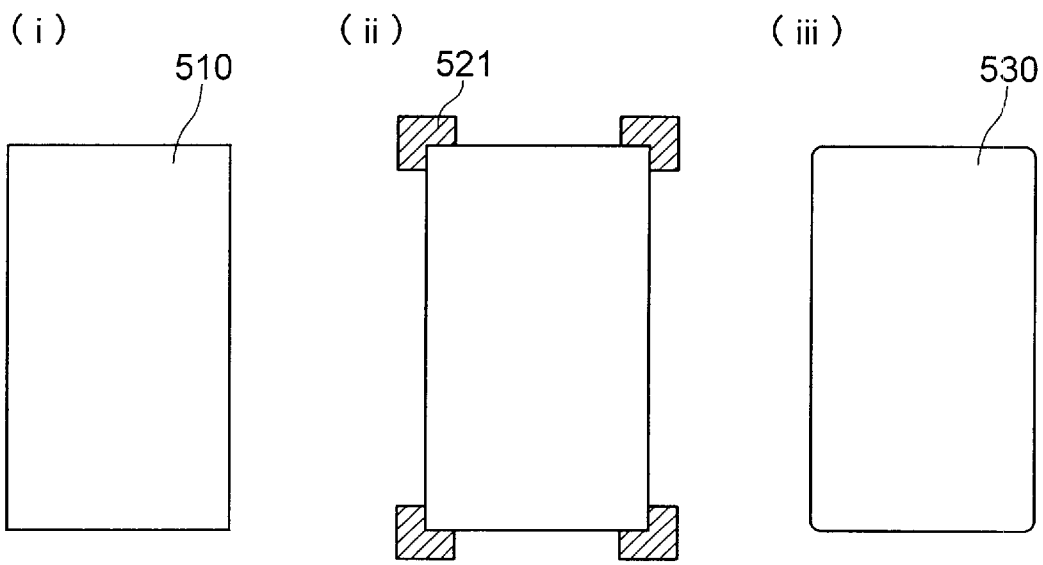
FIGS. 5A and 5B are views for showing a figure of original figure data, a figure of correction figure data corresponding to the original figure data and a wafer pattern corresponding to the original figure data.
Figure 5B:
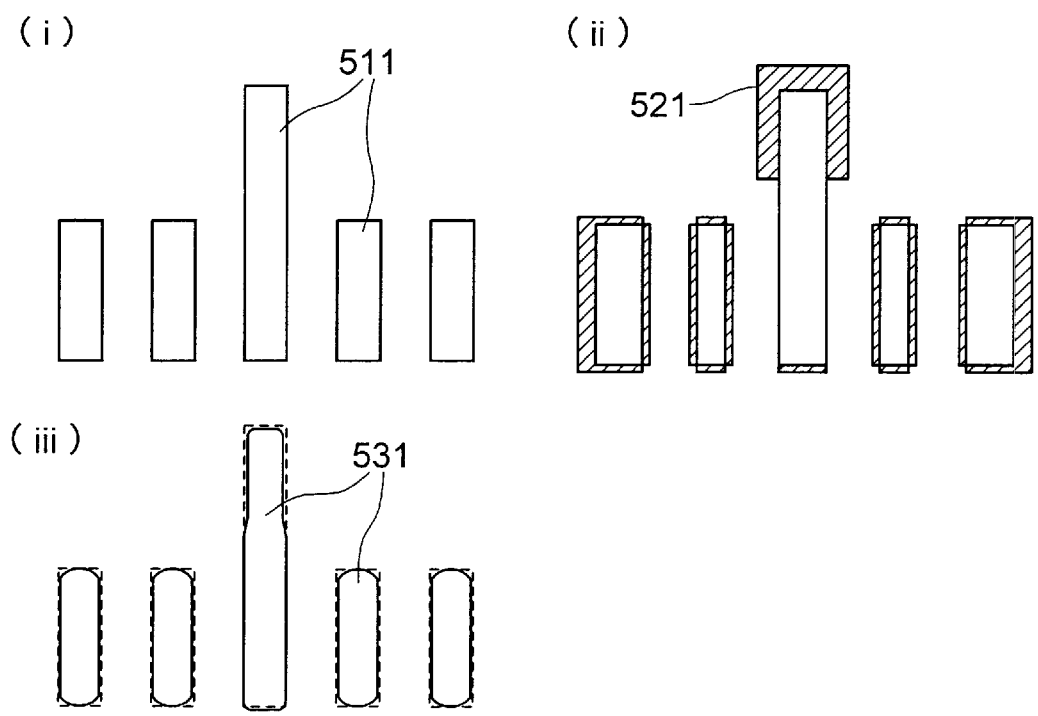
Figure 6:
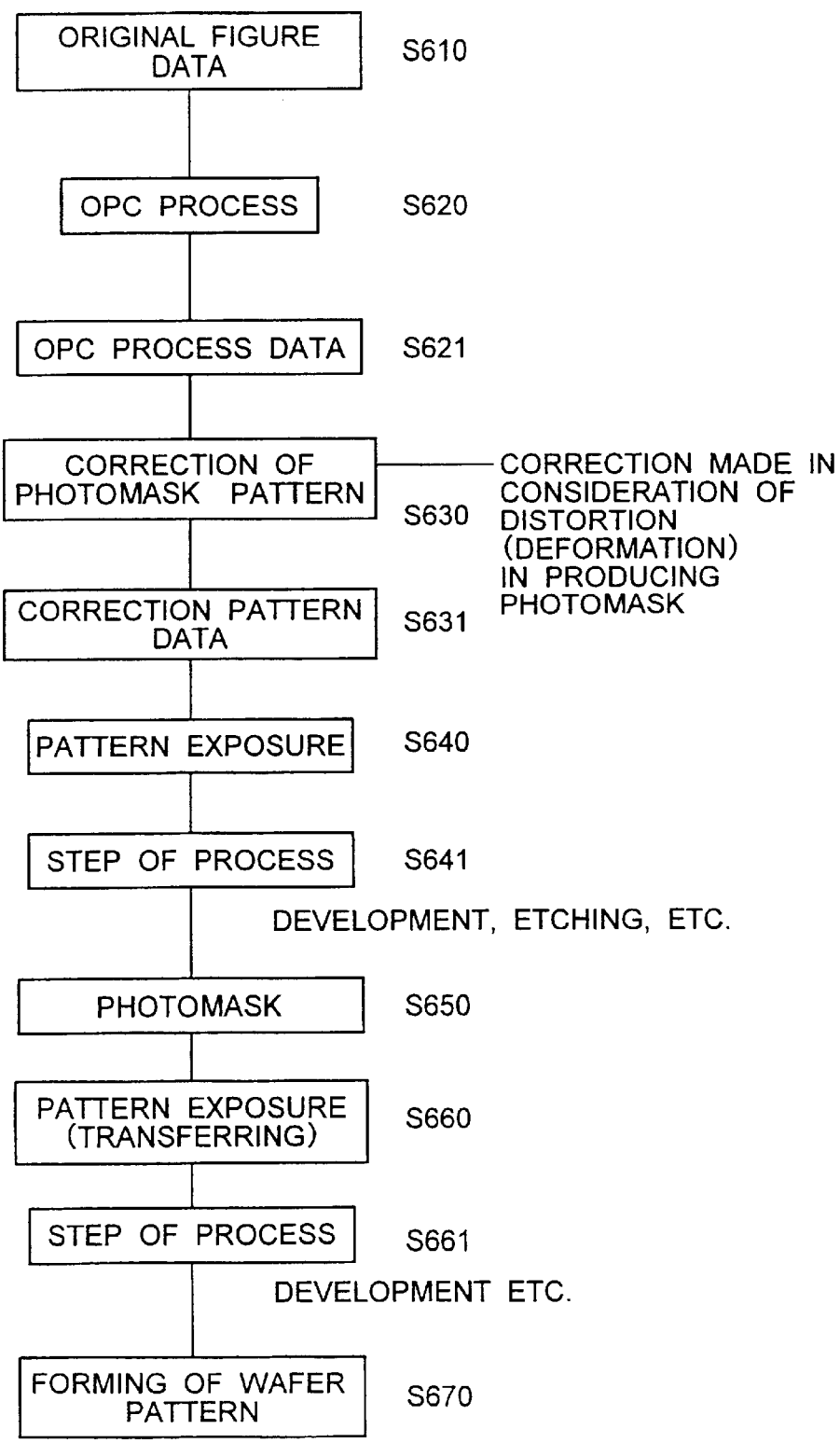
FIG. 6 is a flow sheet of a second example of a conventional method for generating correction figure data.
Figure 7A:
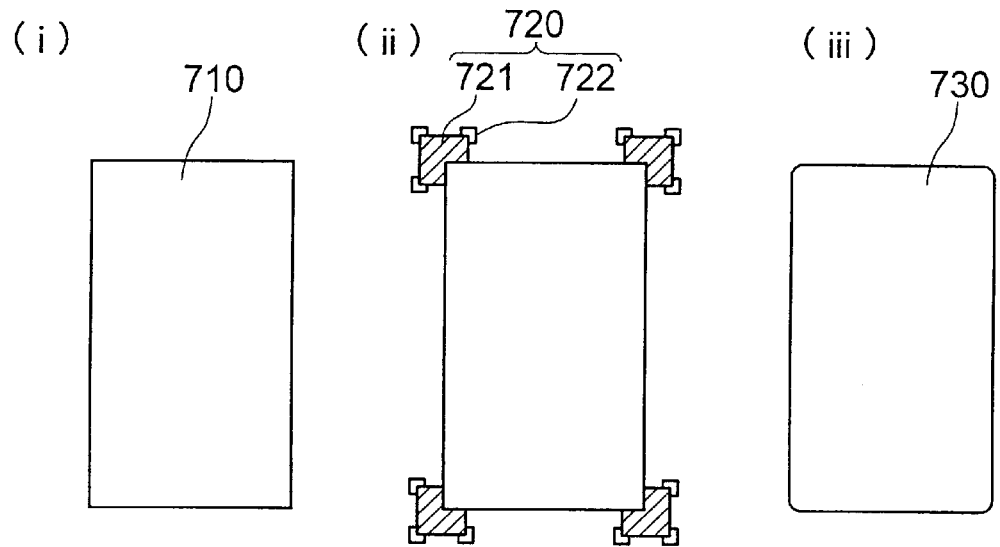
FIGS. 7A and 7B are views of original figure data, a figure of correction figure data corresponding to the original figure data and a wafer pattern corresponding to the original figure data.
Figure 7B:
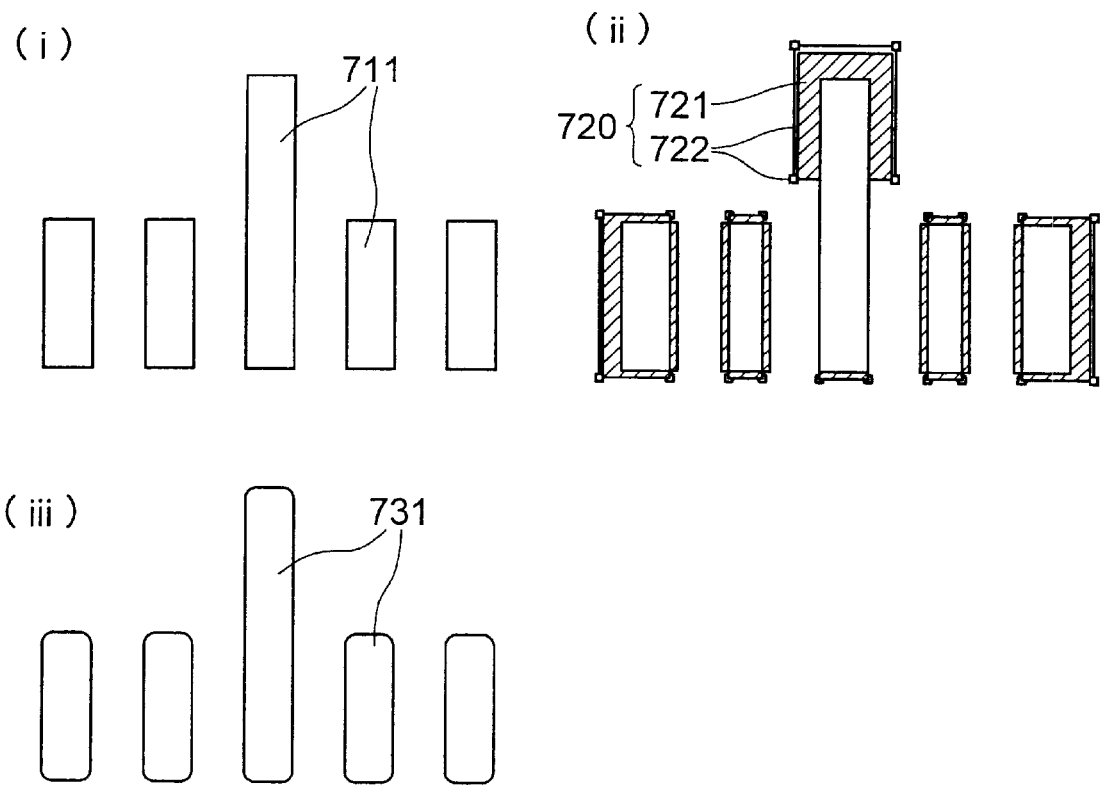
Figure 8A:
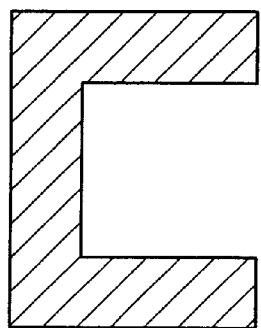
FIGS. 8A and 8B are views for illustrating OPC (optical proximity correction) and figure data for electron beam lithography system provided with OPC section.
Figure 8A:
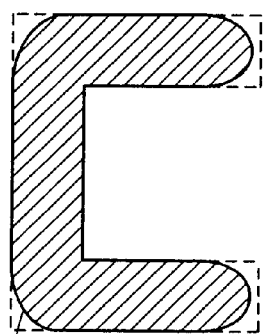
Figure 8B:
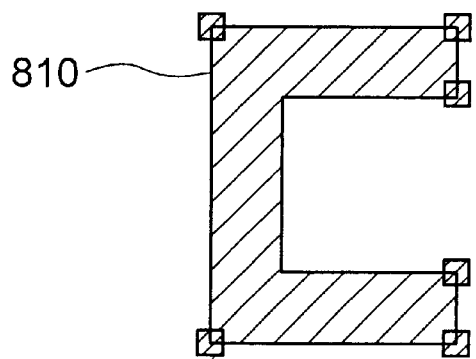
Figure 8B:
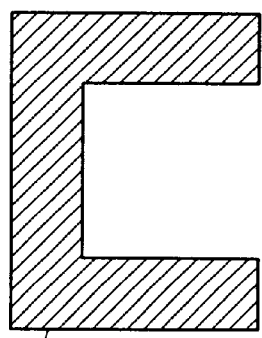

According to the present invention, the same results as that obtained by the second conventional method shown in FIG. 6 in which more accurate pattern can be obtained as compared with the first conventional method shown in FIG. 4 can be obtained by the correction pattern data obtained as above-mentioned. Further, the correction pattern data can be generated at lesser amount of data as compared with the conventional second method.

INDUSTRIAL APPLICABILITY

The present invention made possible to provide a process for making photomask pattern data which is the correction figure data obtained by correcting original figure data for forming a photomask, wherein the objective shape of pattern can be obtained on a wafer, in the middle of the latest progression to miniaturization and higher density of mask pattern.

At the same time, the present invention made possible to provide a process for making photomask pattern data in which the amount of data to be processed do not become tremendous so that data can be processed in the practical processing time.

What is claimed is:

1. A process for making photomask pattern data in which correction pattern data obtained by correcting original figure data of design data used in the pattern exposure system for carrying out pattern exposure for forming a pattern of photomask in order to obtain the objective shape of pattern on a wafer is newly generated as the figure data for the pattern exposure system, characterized in that the method comprises the steps of: (a) a first step for fetching original data of design data as digital data; (b) a second step for extracting the information on distortion (deformation) of formed pattern of from the original figure data when producing a photomask using the original figure data; (c) a third step for extracting the information on the information on distortion (deformation) of formed pattern when producing a pattern on a wafer using the photomask; (d) a fourth step for obtaining the information for determining parts to be corrected and the amount of correction by combining the information obtained in the second step and the information obtained in the third step; and (e) a fifth step for generating the correction figure for correction applied to the original figure data of design data, on the basis of the information obtained in the fourth step, so that correction pattern data is obtained.

2. A method for forming photomask pattern data as claimed in claim 1 wherein in the third step, the amount of distortion (deformation) by diffraction of light at several parts when transferring a mask pattern with the same shape as original figure pattern on a wafer is extracted, by the comparison of a measurement of wafer after a test of transferring of a pattern on a wafer using a test photomask with the test photomask or by simulation, which extracted data of the amount of distortion can be used as the information on distortion (deformation) of formed pattern.

3. A photomask formed through exposure, developing, and etching, using the correction pattern data obtained by correcting original figure data of design data used in the pattern exposure system for carrying out the pattern exposure for a pattern of photomask in order to obtain the objective shape of pattern on a wafer, characterized in that the photomask is formed using the correction figure data made according to the process for making photomask pattern data as claimed in claim 1.

* * * * *